(12) United States Patent
Spears et al.

(10) Patent No.: US 8,395,459 B2
(45) Date of Patent: *Mar. 12, 2013

(54) METHODS FOR TUNING AN ADAPTIVE IMPEDANCE MATCHING NETWORK WITH A LOOK-UP TABLE

(75) Inventors: John H. Spears, Johnsburg, IL (US);
Wayne Smith, Crystal Lake, IL (US);
Chenggang Sui, Ellicott City, MD (US);
Yongfei Zhu, Nashua, NH (US)

(73) Assignee: Research In Motion RF, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/408,624

(22) Filed: Feb. 29, 2012

(65) Prior Publication Data
US 2012/0154069 A1 Jun. 21, 2012

Related U.S. Application Data

(63) Continuation of application No. 13/297,951, filed on Nov. 16, 2011, which is a continuation of application No. 12/236,662, filed on Sep. 24, 2008, now Pat. No. 8,072,285.

(51) Int. Cl.
*H03H 7/38* (2006.01)
(52) U.S. Cl. .................................................. 333/17.3
(58) Field of Classification Search .............. 333/17.3, 333/32
See application file for complete search history.

(56) References Cited

U.S. PATENT DOCUMENTS

| | | |
|---|---|---|
| 4,476,578 A | 10/1984 | Gaudin |
| 5,276,912 A | 1/1994 | Siwiak |
| 5,589,844 A | 12/1996 | Belcher et al. |
| 5,892,482 A | 4/1999 | Coleman et al. |
| 6,115,585 A | 9/2000 | Matero |
| 7,298,329 B2 | 11/2007 | Diament |
| 7,332,981 B2 * | 2/2008 | Matsuno ............ 333/17.3 |
| 7,427,949 B2 | 9/2008 | Channabasappa et al. |
| 7,535,080 B2 | 5/2009 | Zeng et al. |
| 7,633,355 B2 | 12/2009 | Matsuo |
| 7,768,400 B2 | 8/2010 | Lawrence et al. |
| 7,786,819 B2 | 8/2010 | Ella |
| 7,917,104 B2 | 3/2011 | Manssen et al. |
| 7,991,363 B2 | 8/2011 | Greene |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,217,732 B2 | 7/2012 | McKinzie |

(Continued)

FOREIGN PATENT DOCUMENTS

DE 102008050743 4/2010

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

(Continued)

*Primary Examiner* — Stephen Jones
(74) *Attorney, Agent, or Firm* — Guntin & Gust, PLC; Ed Guntin

(57) ABSTRACT

Methods for generating a look-up table relating a plurality of complex reflection coefficients to a plurality of matched states for a tunable matching network. Typical steps include measuring a plurality of complex reflection coefficients resulting from a plurality of impedance loads while the tunable matching network is in a predetermined state, determining a plurality of matched states for the plurality of impedance loads, with a matched state determined for each of the plurality of impedance loads and providing the determined matched states as a look-up table. A further step is interpolating the measured complex reflection coefficients and the determined matching states into a set of complex reflection coefficients with predetermined step sizes.

20 Claims, 3 Drawing Sheets

U.S. PATENT DOCUMENTS

| | | |
|---|---|---|
| 2002/0030566 A1 | 3/2002 | Bozler |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0187780 A1 | 12/2002 | Souissi |
| 2003/0142022 A1 | 7/2003 | Ollikainen |
| 2003/0199286 A1 | 10/2003 | D du Toit |
| 2003/0210206 A1 | 11/2003 | Phillips |
| 2004/0090372 A1 | 5/2004 | Nallo |
| 2004/0100341 A1 | 5/2004 | Luetzelschwab |
| 2004/0127178 A1 | 7/2004 | Kuffner |
| 2005/0007291 A1 | 1/2005 | Fabrega-Sanchez |
| 2005/0130699 A1 | 6/2005 | Kim |
| 2005/0264455 A1 | 12/2005 | Talvitie |
| 2006/0183433 A1 | 8/2006 | Mori et al. |
| 2006/0205368 A1 | 9/2006 | Bustamante |
| 2007/0063788 A1 | 3/2007 | Zhu |
| 2007/0182636 A1 | 8/2007 | Carlson |
| 2007/0184825 A1 | 8/2007 | Lim et al. |
| 2007/0293176 A1 | 12/2007 | Yu |
| 2008/0007478 A1 | 1/2008 | Jung |
| 2008/0018541 A1 | 1/2008 | Pang |
| 2008/0081670 A1 | 4/2008 | Rofougaran |
| 2008/0106350 A1 | 5/2008 | McKinzie |
| 2008/0129612 A1 | 6/2008 | Wang |
| 2008/0261544 A1 | 10/2008 | Blin |
| 2008/0305749 A1 | 12/2008 | Ben-Bassat |
| 2009/0002077 A1 | 1/2009 | Rohani et al. |
| 2009/0082017 A1 | 3/2009 | Chang et al. |
| 2009/0109880 A1 | 4/2009 | Kim et al. |
| 2009/0121963 A1 | 5/2009 | Greene |
| 2009/0180403 A1 | 7/2009 | Tudosoiu |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0073103 A1 | 3/2010 | Spears et al. |
| 2010/0105425 A1 | 4/2010 | Asokan |
| 2010/0232474 A1 | 9/2010 | Rofougaran et al. |
| 2011/0012790 A1 | 1/2011 | Badaruzzaman |
| 2011/0102290 A1 | 5/2011 | Milosavljevic |
| 2011/0121079 A1 | 5/2011 | Lawrence et al. |
| 2011/0133994 A1 | 6/2011 | Korva |
| 2011/0183628 A1 | 7/2011 | Baker |
| 2011/0256857 A1 | 10/2011 | Chen et al. |
| 2012/0100802 A1 | 4/2012 | Mohebbi |

OTHER PUBLICATIONS

Huang, Libo et al., "Theoretical and experimental investigation of adaptive antenna impedance matching for multiband mobile phone applications", IEEE, Sep. 7, 2005, 13-17.

Patent Cooperation Treaty, "International Search Report and Written Opinion", Nov. 16, 2011, International Application No. PCT/US/2011/038543.

Petit, Laurent , "MEMS-Switched Parasitic-Antenna Array for Radiation Pattern Diversity", IEEE Transactions on Antennas and Propagation, vol. 54, No. 9, Sep. 2009, 2624-2631.

Zuo, S. , "Eigenmode Decoupling for Mimo Loop-Antenna Based on 180 Coupler", Progress in Electromagnetics Research Letters, vol. 26, 2011, 11-20.

* cited by examiner

FIG. 4

| FREQUENCY BAND | COMPLEX IMPEDANCE LOAD | | MEASURED COMPLEX REFLECTION COEFICIENT | | DETERMINED SETTINGS | | |
|---|---|---|---|---|---|---|---|
| | MAGNITUDE | PHASE | MAGNITUDE | PHASE | DAC1 | DAC2 | DAC3 |
| 1 | 0.2 | 0 | | | | | |
| 1 | 0.2 | 120 | | | | | |
| 1 | 0.2 | 240 | | | | | |
| 1 | 0.4 | 0 | | | | | |
| 1 | 0.4 | 120 | | | | | |
| 1 | 0.4 | 240 | | | | | |
| 1 | 0.6 | 0 | | | | | |
| 1 | 0.6 | 120 | | | | | |
| 1 | 0.6 | 240 | | | | | |
| 2 | 0.2 | 0 | | | | | |
| 2 | 0.2 | 120 | | | | | |
| ⋮ | ⋮ | ⋮ | ⋮ | ⋮ | ⋮ | ⋮ | ⋮ |
| N | 0.6 | 240 | | | | | |

FIG. 5

| FREQUENCY BAND | MEASURED COMPLEX REFLECTION COEFICIENT | | ADDRESS POINTER | INTERPOLATED SETTINGS | | |
|---|---|---|---|---|---|---|
| | MAGNITUDE | PHASE | | DAC1 | DAC2 | DAC3 |
| 1 | 0.2 | 0 | 0 | | | |
| 1 | 0.2 | 120 | 1 | | | |
| 1 | 0.2 | 240 | 2 | | | |
| 1 | 0.4 | 0 | 3 | | | |
| 1 | 0.4 | 120 | 4 | | | |
| 1 | 0.4 | 240 | 5 | | | |
| 1 | 0.6 | 0 | 6 | | | |
| 1 | 0.6 | 120 | 7 | | | |
| 1 | 0.6 | 240 | 8 | | | |
| 2 | 0.2 | 0 | 9 | | | |
| 2 | 0.2 | 120 | 10 | | | |
| ⋮ | ⋮ | ⋮ | ⋮ | ⋮ | ⋮ | ⋮ |
| N | 0.6 | 240 | X | | | |

METHODS FOR TUNING AN ADAPTIVE IMPEDANCE MATCHING NETWORK WITH A LOOK-UP TABLE

CROSS-REFERENCE TO RELATED APPLICATIONS

This application is a continuation of U.S. patent application Ser. No. 13/297,951 filed Nov. 16, 2011, which is a continuation of U.S. patent application Ser. No. 12/236,662, filed Sep. 24, 2008, the disclosures of which are incorporated herein by reference in their entirety.

FIELD OF THE INVENTION

The present invention relates generally to methods for tuning an impedance matching network, and more specifically to methods for tuning an impedance matching network with a look-up table.

BACKGROUND OF THE INVENTION

Electronic communication products which transmit and receive radio frequency (RF) signals need to match the impedances between the internal circuitry, such as an RF power amplifier, and the antenna for optimum performance of the product. The optimum mode may also depend upon the modulation scheme, the frequency of transmission and other considerations.

Electronically tunable filters are frequently used to compensate for any impedance mismatch between the circuitry and the antenna. Such tunable filters utilize various tuning elements, such as tunable capacitors, varactors, micro-electronic mechanical systems (MEMS), and doped semiconductor materials.

Adaptive impedance matching modules (AIMMs) sense continually sense impedance mismatch and retune the impedance for any changed conditions. AIMMs may take up to 20 iterative steps to converge on the best impedance match, such as by using gradient search methods.

There is a need for an adaptive impedance matching network which can rapidly tune to the best or optimum matching impedance in fewer steps and in less time.

SUMMARY OF THE INVENTION

The present invention is directed to methods for generating and using a look-up table relating a plurality of complex reflection coefficients to a plurality of matched states for a tunable matching network. In one embodiment, typical steps of the methods include measuring a plurality of complex reflection coefficients resulting from a plurality of impedance loads while the tunable matching network is in a predetermined state, determining a plurality of matched states for the plurality of impedance loads, with a matched state determined for each of the plurality of impedance loads, and providing the determined matched states in a look-up table. These steps may be reiterated for different frequency bands, different frequencies or for different use cases.

In other embodiments, the methods may include additional steps such as interpolating the measured complex reflection coefficients and the determined matching states into a set of complex reflection coefficients with predetermined step sizes, selecting the predetermined state used in measuring the complex reflection coefficients to minimize tolerance variations based upon temperature coefficient, component tolerance or tolerance over time, using the determined matched states in the look-up table to tune the tunable matching network, tuning the tunable matching network to adaptively match the impedance of an antenna, controlling the tunable impedance elements with digital to analog converters.

The tunable matching network plurality of tunable impedance elements, may include a which may be, for example, ferroelectric capacitors, voltage variable capacitors, MEMS, tunable inductors or networks thereof.

Yet another embodiment includes methods for generating a look-up table relating a set of measured parameters to a set of matched states for a tunable matching network, including the steps of measuring a set of parameters associated with a plurality of impedance loads while the tunable matching network is in a predetermined state, determining a matched state for each of the plurality of impedance loads, and providing the determined matched states as a look-up table. The set of measured parameters may be selected from the group consisting of complex reflection coefficients, current drain, incident power, reflected power, control setting of the tunable matching network, temperature, input power level, reliability considerations and linearity considerations. Preferably, a sufficient number of matched states are provided such that a transition from one matched state to an adjacent matched state provides a smooth transition.

A further embodiment may include methods of adaptively tuning a tunable impedance matching network with a lookup table, the lookup table containing a plurality of complex reflection coefficients corresponding to a plurality of impedance mismatches between an input terminal and an output terminal of the tunable impedance matching network, including the steps of determining the impedance mismatch between the input and output terminals of the tunable impedance matching network, determining the closest impedance mismatch in the lookup table, and using the complex reflection coefficients in the lookup table which correspond to the determined closest impedance mismatch to tune the tunable impedance matching network. Further steps may include controlling the ferroelectric capacitors with digital to analog converters, and tuning the tunable impedance matching network to adaptively match the impedance of an antenna.

Another embodiment may include methods of adaptively tuning a tunable impedance matching network with a lookup table, the lookup table containing sets of parameters corresponding to matched states for the tunable impedance matching network, including the steps of selecting a parameter from the group consisting of complex reflection coefficients, current drain, incident power, reflected power, control setting of the tunable matching network, temperature, input power level, reliability considerations and linearity considerations, determining the closest match to the selected parameter in the lookup table, and using the closest match to the selected parameter in the lookup table to tune the tunable impedance matching network. The parameter may also be selected to minimize tolerance variations based upon temperature coefficient, component tolerance or tolerance over time.

BRIEF DESCRIPTION OF THE DRAWINGS

The invention, together with its objects and the advantages thereof, may best be understood by reference to the following description taken in conjunction with the accompanying drawings, in which like reference numerals identify like elements in the figures, and in which:

FIG. 4 is a sample look-up table which correlates complex impedance loads with measured complex reflection coefficients and determined settings of a plurality of digital to analog converters;

FIG. 5 is a table illustrating how an address pointer corresponds to the independent variables and the adaptive impedance matching network settings; and FIG. 6 is another sample look-up table with interpolated settings for a plurality of digital to analog converters resulting from interpolation of measured complex reflection coefficients and determined settings which are found in the table shown in FIG. 4.

DESCRIPTION OF THE PREFERRED EMBODIMENTS

It will be understood that the present invention may be embodied in other specific forms without departing from the spirit thereof. The present examples and embodiments, therefore, are to be considered in all respects as illustrative and not restrictive, and the invention is not to be limited to the details presented herein.

Figure 1:
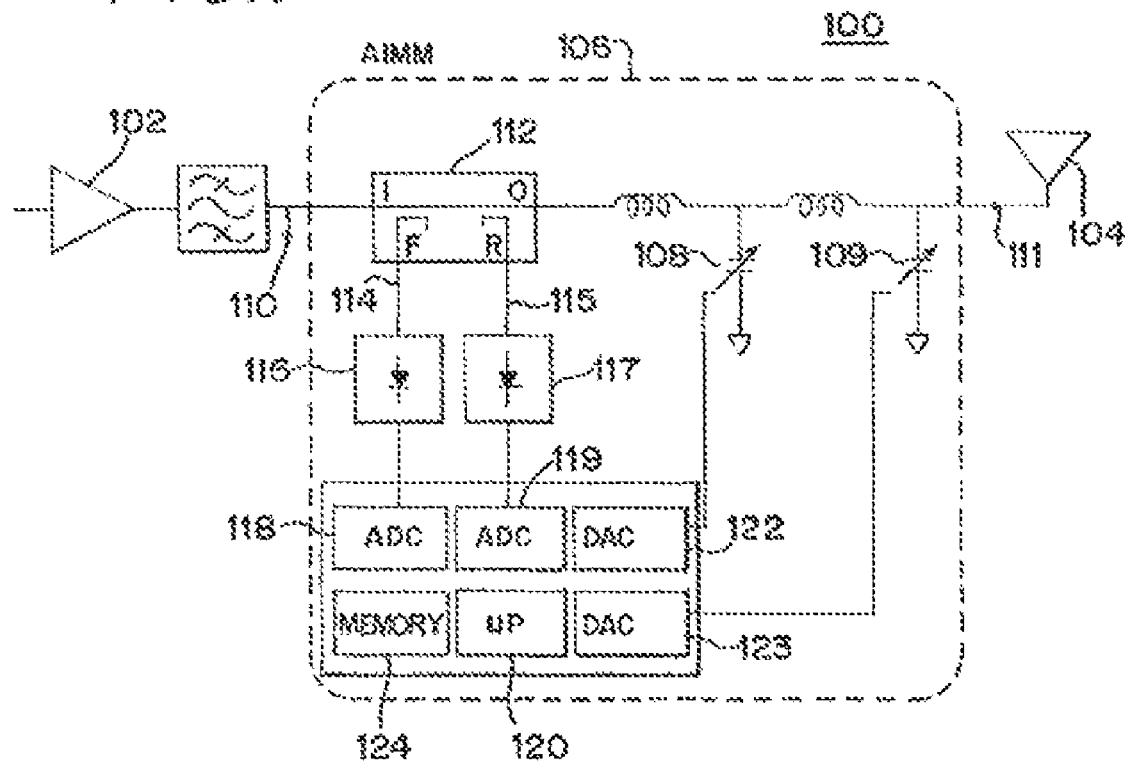
FIG. 1 is a schematic diagram of an impedance matching circuit for including variable capacitors for impedance optimization.

FIG. 1 illustrates an impedance matching circuit, generally designated 100, for impedance optimization between a source of radiofrequency (RF) power, such as an RF amplifier 102, and an RF load, such as an antenna 104. An adaptive impedance matching network 106 is coupled between RF amplifier 102 and antenna 104. In the example of FIG. 1, the adaptive impedance matching network 106 is an adaptive impedance matching module (AIMM). AIMM 106 dynamically adjusts its internal impedance matching circuit to minimize reflected power to achieve a near-optimal impedance match. For example, a common application for AIMM 106 is to correct antenna-RF amplifier impedance mismatch that often occurs with handheld radios and body-worn antennas. Similarly, handheld communications devices, such as cellular telephones encounter impedance mismatch when the communication device is held close to the user's head or torso. Yet another application for the AIMM 106 is in sensor networks where the antenna of the sensor can be detuned by proximity effects of the ground, foliage or debris. In general, AIMM 106 may be used in any application where forward power needs to be maximized and reverse power needs to be minimized.

AIMM 106 may be a multi-chip module comprising a tunable impedance network, which contains one or more tunable ferroelectric capacitors 108-109. Preferably, the tunable ferroelectric capacitors 108-109 are Paratek's ParaTune™ family of passive tunable integrated circuits (PTICs), which are commercially available from Paratek Microwave, Inc. of Columbia, Md. These PTICs 108-109 utilize a Parascan® tunable dielectric material which is further described in U.S. Pat. Nos. 7,107,033 and 6,514,895, which are assigned to the same assignee as the present invention and which are incorporated herein by reference in their entirety. These PTICs 108-109 overcome the power limitations common to other tunable technologies such as varactor diodes and MEMS and can handle in excess of 2 watts of RF power with extremely low inter-modulation distortion.

The adaptive impedance matching module or AIMM 106 in FIG. 1 has an input terminal 110 for receiving an RF signal from RF amplifier 102. A forward and reverse power detector 112 provides a signal on line 114 to a rectifier 116 which is representative of the forward power from RF amplifier 102. Rectifier 116 provides a rectified value of the forward RF power to an analog to digital converter (ADC) 118, which in turn provides a digital representation of the forward power to a microprocessor 120. In a similar fashion, the power detector 112 provides a signal on line 115 to a rectifier 117 which is representative of the reverse or reflected power from antenna 104. Rectifier 117 provides a rectified value of the reverse RF power to an ADC 119, which in turn provides a digital representation of the reverse power to a microprocessor 120.

Based upon the values of the determined forward and reverse power levels, and in accordance with one aspect of the present invention, microprocessor 120 uses a lookup table, such as table 400 in FIG. 4 or table 600 in FIG. 6, which may be resident in memory 124 to determine bias adjustments to be made to the PTICs 108-109 for a first step of retuning the adaptive impedance of the AIMM 106. To this end, microprocessor 124 supplies digital signals to digital to analog converters (DACs) 122-123 which control the analog bias signals to PTICs 108-109. Microprocessor 120 may continue with additional steps of retuning the PTICs, as needed, to provide a near-optimum impedance matching between RF amplifier 102 and antenna 104.

Figure 2:
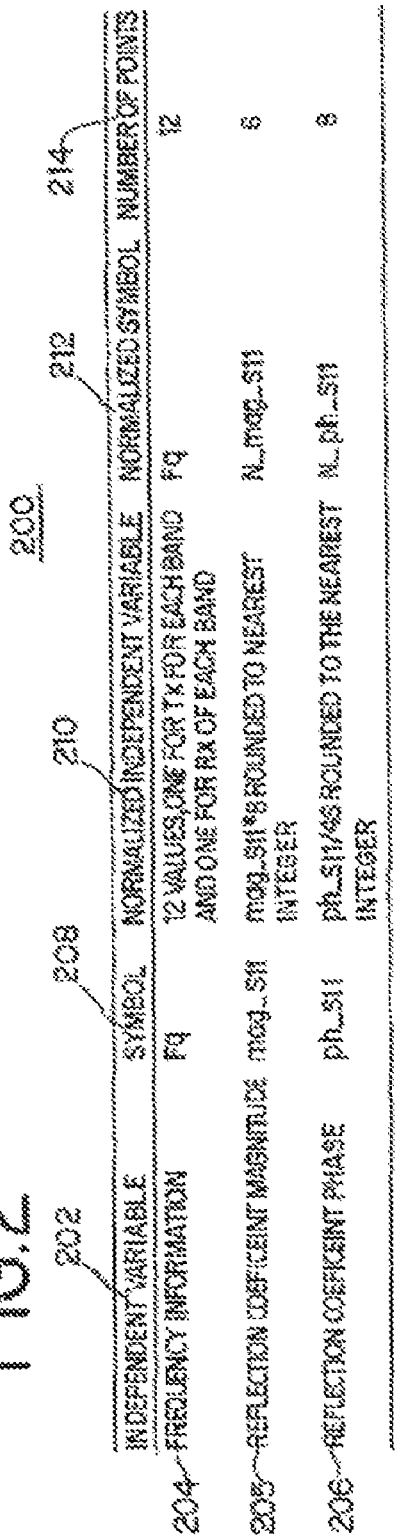
FIG. 2 is a table of exemplary definitions of independent variables and scaling factors, related to the methods of the present invention.

FIG. 2 illustrates a table, generally designated 200, which is an example of how independent variables 202 may be defined and organized. For example, the independent variables 202 may include frequency information 204, reflection coefficient magnitude 205 and reflection coefficient phase 206. Furthermore, each of these independent variables may have a symbol 208, a normalized independent variable 210, a normalized symbol 212 and a number of points 214.

As shown in the example of FIG. 2, the frequency information 204 may be associated with a symbol Fq and a normalized symbol Fq, and may consist of 12 values including one value for each transmit frequency band and one value for each receive frequency band. The frequency variable for the frequency information 204 may also be accorded 12 points. Similarly, the reflection coefficient magnitude 205 has a symbol mag_S11, a normalized symbol N_mag_S11, and a normalized independent variable determined as mag_S 11 times 8 and then rounded to the nearest integer. The reflection coefficient magnitude 205 is accorded 6 points. Lastly, the reflection coefficient phase 206 has a symbol ph_S11, a normalized symbol Nyh_S11, and a normalized independent variable determined as divided by 45 and then rounded to the nearest integer. The reflection coefficient phase 106 is accorded 8 points.

The purpose of a look-up table, such as look-up table 400 in FIG. 4 or look-up table 600 in FIG. 6 is to make it possible for an adaptive impedance matching network, such as adaptive impedance matching module 106 in FIG. I, to take a large first step in tuning. A large first tuning step reduces the time to convergence of final settings, reduces power consumption and decreases traffic on the communication bus.

In accordance with one embodiment of the present invention, the look-up table 400 may contain pairs (or sets) of digital-to-analog (DAC) settings 402 that are to be put into the high voltage application specific integrated circuit (HV-ASIC) for controlling tunable impedance module 106. elements in the adaptive impedance matching The pairs (or sets) of DAC settings 402 can be identified by an index which is correlated to independent variables 202, for example, frequency 204, magnitude S11 205 and phase S11 206. The index would be related to the position in the table 400 of the desired information. Hence, the index information would not need to be stored in the table. The index could be the sum of three independent variables, such as independent variables 202.

In this example, the address pointer, such as address pointer 602 in FIG. 6, may be calculated as pointer =6*8*Fq+ 8*N_ma9_811+N-ph_s11. The table then has 432 rows (=12*6*8). Each has 2 or 3 bytes of information, one for each tunable element setting. The total memory usage for a two tunable element adaptive impedance network is 1152 bytes. The total memory usage for an adaptive impedance matching network with 3 tunable elements is 1728 bytes in this example.

A worst case analysis may typically be required to determine how many different phases and magnitudes are sufficient or insufficient. A key consideration is how accurate the first step needs to be and how much the tolerances may degrade the accuracy. Also, the magnitude and phase of 811 do not have to be scaled linearly. They could be scaled non-linearly to give better accuracy to areas of the Smith chart that are common.

The operation of the adaptive impedance matching module 106 with the look-up table 400 will now be considered. When the adaptive impedance matching module 106 is initially turned-on, it may be programmed to an initial or default state. From the initial state, adaptive impedance matching module 106 will measure the magnitude and phase of the reflection coefficient 205 and 206, lookup the DAC setting 402 in table 400 that corresponds to that reflection coefficient, and take a large first tuning step. The first tuning step can be improved by interpolating between table entries. The first step may be broken into several steps if the modulation accuracy or time mask specifications do not allow for a full step. The default setting may have the following characteristics: a) all tunable elements may be set to the same voltages, and b) the voltage that the tunable elements are set to would correspond to the voltage at which the tolerances have minimal impact, for example: a temperature coefficient that is 0 ppm/C. Many tolerances may degrade the accuracy of the first step. Using the 0 ppm/C temperature coefficient will reduce the contribution of temperature to the tolerance stack-up. The default setting could also be chosen to correspond to the expected load impedance, such as the load-pull system 306, if known.

The magnitude, phase and band information will then be used to calculate the index of the look-up table that represents the best first guess for the first tuning step. Thereafter, adaptive impedance matching network 304 may switch to its standard adaptive search algorithm. Once optimal tuning is achieved, adaptive impedance matching network 304 can switch to a tracking mode, in which step sizes are smaller and/or less often.

Figure 3:
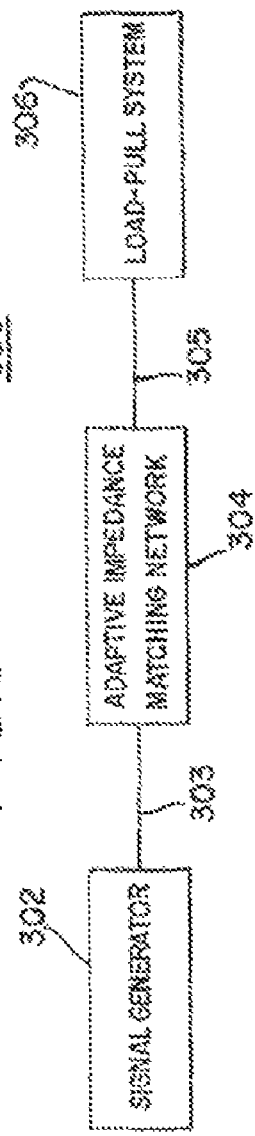
FIG. 3 is a block diagram of a typical characterization set-up for the methods of the present invention.

Consideration will now be given to generating the look-up table, such as tables 400 and 600. These tables may be generated during the design phase after the topology and the tuner values are fixed. A block diagram of the characterization test set-up 300 is shown in FIG. 3. It consists of a signal generator 302 coupled via a conductor 303 to the adaptive impedance matching network 304, which in turn, is coupled via a conductor 305 to a load-pull system 306. This test set-up 300 simulates an end use application of the adaptive impedance matching network 304, in which signal generator 302 may be an RF power amplifier, for example, in a portable communication device such as a cellular telephone, personal digital assistant, or the like. In such an end use application, the load-pull system 306 may be the RF antenna for the portable communication device.

The procedure to generate the table 400 begins with the adaptive impedance matching network 304 in a pause mode, and the tunable element in the adaptive impedance matching network 304 set to the default setting. This may be the bias voltage at which the capacitive temperature coefficient is 0 ppm/C. Note that different settings may be preferable if it results in improved tolerance performance. For example, if there is knowledge of the expected load, the default setting could also be set based on the expected load, such as presented by the load pull system 306.

The signal generator is preferably set to the middle of the frequency range being characterized. As the design is better understood, the designer may choose to use a different frequency that better represents the center of performance. If frequency information is available, a look-up table could be generated for each frequency, as the availability of memory allows or permits.

The load-pull system 306 is run through a fine mesh of the magnitudes and phases. The magnitude and phase of 811 is recorded as measured by adaptive impedance matching network 304 for each load. Alternatively, other parameters could be recorded for use in the table. These parameters may include (but are not limited to) complex reflection coefficient, current drain, incident power, reflected power, reliability metrics, linearity metrics, and the like.

The adaptive impedance matching module 106 is set in the run mode. That is the adaptive impedance matching module 106 is permitted to optimize the match as it would in an end use application. The optimization may be part of the module 106 or apart from it. If the optimization is apart from the module 106, it may be referred to as a tunable impedance matching network. If the optimization is part of the network r it may be referred to as an adaptive impedance matching network. An adaptive impedance matching module 106 always includes a tunable impedance matching network.

As the load-pull system 306 runs through a fine mesh of the magnitudes 404 and phases 405, the DAC settings 402 that adaptive impedance matching network 304 settles on for each load 306 are recorded, as by storage in available memory. At this point, all of the information is available for a look-up table, such as look-up table 400 in FIG. 4.

Using the two data sets 304 and 305, generate contours correlating the 811 measurements to the preferred DAC settings 302. The contours are then used to interpolate to find the preferred or interpolated DAC settings 404 in table 400 (FIG. 4) for each 811 that is to be represented in the look-up table 400.

At this point, the look-up table would be like that of table 600 in FIG. 6. This is an extremely memory efficient table implementation because only the output interpolated DAC settings 604 need to be stored. An address pointer 602 will retrieve the applicable interpolated DAC settings 604. The interpolated DAC settings 604 are preferably organized such that no searching is required, thereby saving processing time.

It will be appreciated by those skilled in the art that the above steps of generating the look-up table, will be performed by a microprocessor or the like. For example, the above steps may be performed by a microprocessor in the product for which the antenna matching is occurring, such as in a cellular telephone, PDA, or the like. Alternately, the microprocessor may be provided in the adaptive impedance matching module 106.

While particular embodiments of the invention have been shown and described, it will be obvious to those skilled in the art that changes and modifications may be made therein without departing from the invention in its broader aspects.

What is claimed is:

1. A non-transitory computer-readable storage medium, comprising computer instructions, which when executed by a processor, cause the processor to perform operations comprising:
   determining an impedance mismatch at a terminal of a tunable impedance matching network;
   determining a closest impedance mismatch in a lookup table, wherein the lookup table comprises a plurality of complex reflection coefficients; and
   using at least one of the plurality of complex reflection coefficients in the lookup table which correspond to the determined closest impedance mismatch to tune the tunable impedance matching network.

2. The non-transitory computer-readable storage medium of claim 1, wherein the plurality of complex reflection coefficients are determined by measuring a signal at the tunable impedance matching network for a plurality of impedance loads.

3. The non-transitory computer-readable storage medium of claim 2, wherein the signal is measured while the tunable impedance matching network is in a predetermined state.

4. A method, comprising:
   determining an impedance mismatch between input and output terminals of a tunable impedance matching network;
   determining a closest impedance mismatch in a lookup table, wherein the lookup table comprises a plurality of complex reflection coefficients determined by measuring a signal at a port of the tunable impedance matching network for a plurality of impedance loads; and
   using one or more complex reflection coefficients in the lookup table which correspond to the determined closest impedance mismatch to tune the tunable impedance matching network.

5. The method of claim 4, wherein the lookup table comprises a plurality of matched states of the tunable impedance matching network for each of the plurality of impedance loads.

6. The method of claim 4, comprising tuning the tunable impedance matching network to adaptively match the impedance of an antenna.

7. The method of claim 4, wherein the signal at the port of the tunable impedance matching network for the plurality of impedance loads is measured while the tunable impedance matching network is in a predetermined state.

8. The method of claim 4, wherein the tunable impedance matching network comprises voltage variable capacitors.

9. The method of claim 8, wherein the voltage variable capacitors are voltage-controlled variable ferroelectric capacitors.

10. The method of claim 9, comprising controlling the voltage-controlled variable ferroelectric capacitors with digital to analog converters.

11. The method of claim 4, wherein the tunable impedance matching network comprises one or more variable reactive elements.

12. The method of claim 11, wherein an impedance of the one or more variable reactive elements is controlled by at least one of one or more semiconductor devices, one or more micro-electro-mechanical systems (MEMS) devices, or one or more reactive elements each having a controllable reactance.

13. A method, comprising:
   selecting a parameter;
   determining a closest match to the selected parameter in a lookup table, wherein the lookup table comprises sets of parameters corresponding to matched states for a tunable impedance matching network for a plurality of impedance loads; and
   using the closest match to the selected parameter in the lookup table to tune the tunable impedance matching network.

14. The method of claim 13, wherein the lookup table comprises a plurality of matched states of the tunable impedance matching network for each of the plurality of impedance loads.

15. The method of claim 13, wherein a signal at a port of the tunable impedance matching network is measured while the tunable impedance matching network is in a predetermined state.

16. The method of claim 13, wherein the lookup table comprises a sufficient number of matched states such that a transition from one matched state to an adjacent matched state provides a smooth transition.

17. The method of claim 13, comprising selecting the parameter to minimize tolerance variations based upon a temperature coefficient, a component tolerance or a tolerance over time.

18. The method of claim 13, wherein the tunable impedance matching network comprises variable reactive components.

19. The method of claim 18, wherein the variable reactive components are at least one of variable capacitors, variable inductors, or combinations thereof.

20. The method of claim 13, comprising selecting the parameter from a group consisting of complex reflection coefficients, current drain, incident power, reflected power, control setting of a tunable matching network, temperature, input power level, reliability considerations and linearity considerations.

* * * * *